United States Patent
Ebner et al.

(10) Patent No.: US 9,069,028 B2
(45) Date of Patent: Jun. 30, 2015

(54) MAGNETIC STUD FASTENER FINDER

(76) Inventors: Emmett J. Ebner, Santa Ana, CA (US);
Brian J. Huffer, Santa Ana, CA (US)

( * ) Notice: Subject to any disclaimer, the term of this patent is extended or adjusted under 35 U.S.C. 154(b) by 128 days.

(21) Appl. No.: 13/274,038

(22) Filed: Oct. 14, 2011

(65) Prior Publication Data

US 2013/0093417 A1 Apr. 18, 2013

(51) Int. Cl.
*G01R 33/00* (2006.01)

(52) U.S. Cl.
CPC .......... *G01R 33/007* (2013.01); *G01R 33/0076* (2013.01)

(58) Field of Classification Search
CPC ....................... G01R 33/02; G01V 3/08–3/081
USPC ..................................... 324/228, 67, 226, 200
See application file for complete search history.

(56) References Cited

U.S. PATENT DOCUMENTS

| | | | | |
|---|---|---|---|---|
| 2,933,679 A * | 4/1960 | Bray | .............................. | 324/228 |
| 3,363,208 A * | 1/1968 | Balet | .............................. | 335/285 |
| 3,845,384 A * | 10/1974 | Stoutenberg et al. | ......... | 324/228 |
| 4,310,797 A * | 1/1982 | Butler | ............................ | 324/228 |
| 4,896,131 A * | 1/1990 | Podlesny et al. | .............. | 335/302 |
| 5,148,108 A | 9/1992 | Dufour | | |
| D339,074 S | 9/1993 | Dufour | | |
| 5,296,806 A * | 3/1994 | Hurl, Jr. | ......................... | 324/214 |
| 5,813,130 A * | 9/1998 | MacDowell | .................... | 33/528 |
| 6,229,294 B1 * | 5/2001 | Wun | ............................... | 324/67 |
| 6,456,053 B1 * | 9/2002 | Rowley | ........................... | 324/67 |
| 6,674,276 B2 * | 1/2004 | Morgan et al. | .................. | 324/67 |
| 6,747,536 B1 * | 6/2004 | Miller, Jr. | ...................... | 335/285 |
| 6,894,508 B2 * | 5/2005 | Sanoner et al. | ............... | 324/662 |
| 7,134,217 B2 * | 11/2006 | Melittas | ......................... | 33/528 |
| 7,161,343 B1 * | 1/2007 | Biary | .............................. | 324/67 |
| 7,690,124 B1 * | 4/2010 | Henry | ............................ | 33/286 |
| 8,026,717 B1 * | 9/2011 | Biary | ............................. | 324/228 |
| 2005/0223578 A1 * | 10/2005 | Scarborough | .................. | 33/451 |
| 2005/0251921 A1 * | 11/2005 | Del Cogliano | .................... | 7/143 |
| 2006/0000100 A1 * | 1/2006 | Melittas | ......................... | 33/528 |
| 2008/0141546 A1 * | 6/2008 | Strutt et al. | ..................... | 33/381 |
| 2011/0267050 A1 * | 11/2011 | Flores | ........................... | 324/259 |

OTHER PUBLICATIONS

Website Printout. Rowley Products Inc. "Finally a Stud Finder That Works" and "How It Works", Aug. 25, 2011, pp. 5, http://www.rowleyproducts.com/.

\* cited by examiner

*Primary Examiner* — Patrick Assouad
*Assistant Examiner* — Demetrius Pretlow
(74) *Attorney, Agent, or Firm* — Stetina Brunda Garred & Brucker

(57) ABSTRACT

Provided is a stud finder for determining the location of a stud within a wall. The stud finder includes a body having an internal compartment formed therein which is sized and configured to house a magnetic element therein. The stud finder is moveable along the wall to place the magnetic element in magnetic attraction with metallic fasteners (i.e., nails, screws, etc) disposed within the stud, such as for securing drywall to the stud. The magnetic attraction urges the magnetic element toward the metallic element to provide a visual indication as to the precise location of the metallic element, as well as the underlying stud.

21 Claims, 2 Drawing Sheets

MAGNETIC STUD FASTENER FINDER

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

1. Field of the Invention

The present invention relates generally to a stud finder, and more specifically to a stud finding device having a magnetic element disposed within an internal compartment.

2. Description of the Related Art

In both residential and commercial building construction, drywall or another similar wall forming material is typically secured to support studs via mechanical fasteners, such as nails or screws. The mechanical fasteners are oftentimes concealed by putty or other material to give the appearance of a continuous wall surface.

On occasion, it is to locate the studs beneath the walls or roofs and the like. Along these lines, it may be important, if not critical, to locate a structural stud member to perform even the simple task of hanging a picture or installing a new set of shelves. The hardware for hanging the picture or for supporting the shelves is typically driven into the studs to maximize the structural durability thereof. If the hardware is not driven into the studs, the picture or shelves may fall from the wall.

Various solutions in the prior art are known to reduce the likelihood of missing the stud when inserting hardware therein. Early solutions included locating studs by tracing or mapping their location on to the drywall during installation of the drywall. For example, mapping typically involved marking the drywall along a pair of spaced horizontal axis at set distances, and then using a straight-edge to trace a vertical line that connects each pair of marks and thereby illustrate the location of each stud. While this solution helped to locate the studs, the tracing could often be very time-consuming and lack the accuracy required for proper drywall installation. Other early solutions included pounding a small nail into the wall until the nail hit a stud. However, this technique would generally be tedious, time consuming, and generally results in several holes formed within the drywall.

In view of the deficiencies associated with early stud finding techniques, handheld electronic stud finders have been developed. More specifically, electronic wall stud sensors typically employ electronic sensing circuitry to accurately determine the location of the stud. Electronic stud finders typically use changes in capacitance to sense a stud's location. When the stud finder is over a surface such as wallboard, it will sense one dielectric constant but when over a stud, the dielectric constant is different. It typically works on a capacitance differential generated by density differences. The circuit in the stud finder can sense changes and report it on its display.

Although electronic stud finders may provide certain benefits relative to the earliest stud finding techniques, electronic stud finders generally suffer from several deficiencies. One deficiency is the cost associated therewith. The components typically included in the electrical stud finders, such as electrical circuitry, power sources, indication means, etc., generally results in a higher cost, particularly relative to the cost associated with the earlier stud finding techniques. Another deficiency associated with electronic stud finders is that they may not accurately indicate the position of the stud located behind a wall. For instance, the wall may include wiring, plumbing and other support structures which may interfere with the electronic stud finder's search for the stud.

As is apparent from the foregoing, there exists a need in the art for a reliable and easy to use stud finding tool. The present invention addresses this particular need, as will be discussed in more detail below.

BRIEF SUMMARY OF THE INVENTION

According to an aspect of the present invention, there is provided a stud finder for determining the location of a stud within a wall. The stud finder includes a body having an internal compartment formed therein which is sized and configured to contain a magnetic element. The stud finder is moveable along the wall to place the magnetic element in magnetic attraction with a metallic element, such as a fastener (i.e., nails, screws, etc) disposed within the stud for securing drywall to the stud. The magnetic attraction between the magnetic element and the metallic element urges the magnetic element toward the metallic element to provide a visual indication as to the precise location of the metallic element, as well as the underlying stud.

The stud finder may provide a reliable, easy to use, and inexpensive stud finding tool. Along these lines, the stud finder may not require expensive electrical components, which would otherwise be found in more costly electronic stud finding tools. Furthermore, the stud finder is configured to reliably determine the location of the stud by determining the presence of metallic objects disposed within the stud. Therefore, the stud finder provides a simple and cost-effective solution to the above-described deficiencies associated with conventional stud finding equipment.

The stud finder body may be an elongate body having a plurality of internal compartments formed therein, as well as a plurality of magnetic elements disposed in respective ones of the plurality of internal compartments. The magnetic elements may be detached from the body and freely moveable within the respective internal compartment. The plurality of internal compartments may be spaced from each other to maintain the magnetic elements in spaced relation so as to mitigate attraction or repulsion between the magnetic elements. The internal compartments may be spaced along a longitudinal axis defined by the tool such that the centers of the internal compartments are approximately six inches apart from each other, which is commensurate with certain construction codes requiring drywall hanging fasteners to be spaced no more than six inches apart from each other.

The body may be formed from a transparent material to allow a user to easily view the magnetic element disposed therein as it moves within the internal compartment. The body may also extend in a longitudinal direction to define a length which is approximately equal to sixteen inches, which is similar to the distance between adjacent studs according to standard construction guidelines.

The present invention is best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings in which like numbers refer to like parts throughout and in which.

Common reference numerals are used throughout the drawings and detailed description to indicate like elements.

DETAILED DESCRIPTION OF THE INVENTION

Figure 1:
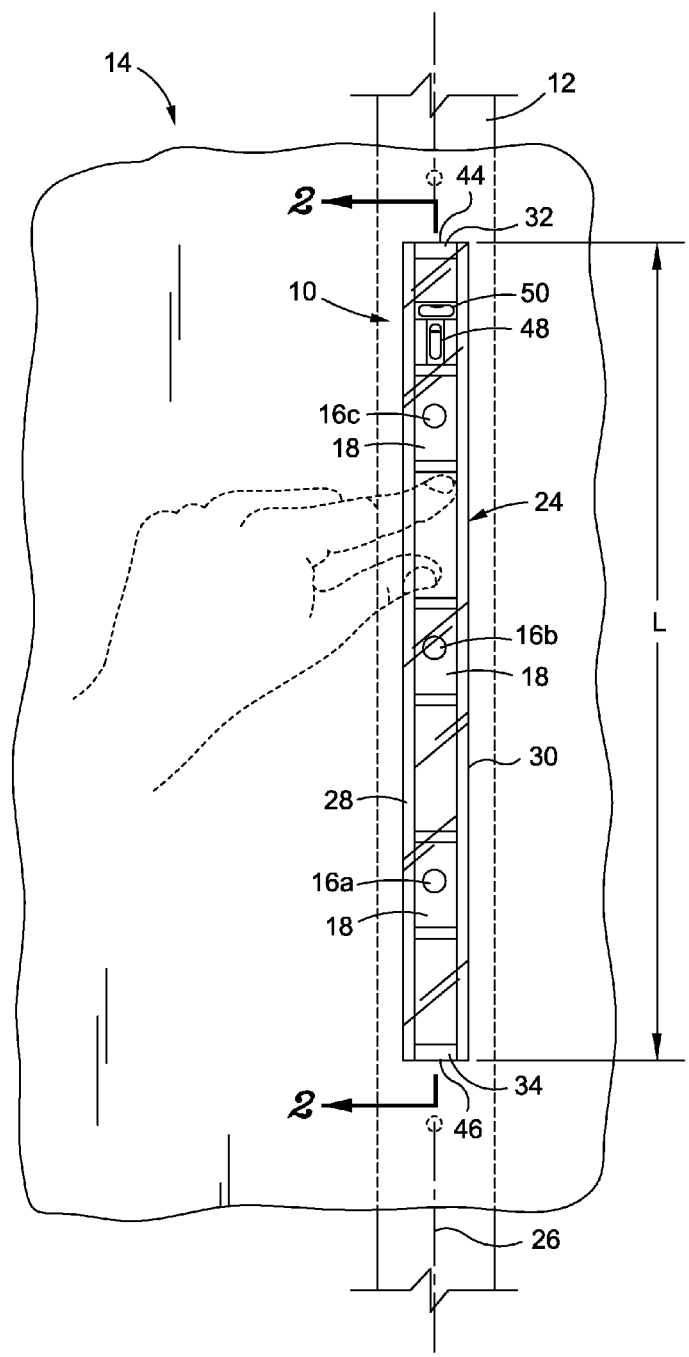
FIG. 1 is a front view of a stud finder disposed along a wall, wherein the stud finder is in alignment with a stud.

The detailed description set forth below is intended as a description of the presently preferred embodiment of the invention, and is not intended to represent the only form in which the present invention may be constructed or utilized. The description sets forth the functions and sequences of steps for constructing and operating the invention. It is to be understood, however, that the same or equivalent functions and sequences may be accomplished by different embodiments and that they are also intended to be encompassed within the scope of the invention.

Referring now to the drawings, wherein the showings are for purposes of illustrating a preferred embodiment of the present invention only, and not for purposes of limiting the same, there is shown a stud finder 10 configured to identify the location of a stud 12 behind a wall 14. The stud finder 10 includes a magnetic element 16 disposed within an internal compartment 18 of the stud finder 10, wherein the magnetic element 16 is not attached to any structure of the internal compartment 18 and is therefore free to move within the internal compartment 18. In this respect, the magnetic element 16 may move within the internal compartment 18 along at least two axes. The stud finder 10 utilizes the magnetic attraction between the magnetic element 16 and the screws, nails, or other metallic fasteners 20 used to attach the drywall 22 to the stud 12. The user slides the stud finder 10 along the wall 14 and when the internal compartment 18 housing the magnetic element 16 is disposed adjacent a metallic fastener 20, the magnetic element 16 becomes magnetically attracted to the metallic fastener 20, which in turn urges the magnetic element 16 toward the metallic fastener 20. The magnetic attraction between the magnetic element 16 and the mechanical fasteners 20 alerts the user as to the location of the mechanical fastener 20 and thus also to the location of the underlying stud 12. The movement of the magnetic element 16 within the internal compartment 18 may cause the magnetic element 16 to contact the walls of the internal compartment 18 to create a "clicking" sound as the magnetic element 16 moves toward the metallic fastener 20. Therefore, the stud finder 10 may provide a visual indication (i.e., the movement of the magnetic element 16) and an audible indication (i.e., the clicking of the magnetic element 16 against the walls of the internal compartment 18) to alert the user as to the location of the stud 12.

In the exemplary embodiment depicted in the figures, the stud finder 10 includes an elongate body 24 defining a longitudinal axis 26. The body 24 includes a first lateral wall 28, a second lateral wall 30, a first end wall 32, and a second end wall 34. The first and second lateral walls 28, 30 are disposed and spaced, generally parallel relation to each other. Likewise, the first and second end walls 32, 34 are disposed and spaced, generally parallel relation to each other and extend between the first and second lateral walls 28, 30 in generally perpendicular alignment thereto. The elongate body 24 additionally includes a front wall 36 (See FIG. 3) and an opposing rear wall 38 (See FIG. 3), with the front and rear walls 36, 38 extending between the first and second lateral walls 28, 30 and the first and second end walls 32, 34 in spaced relation to each other.

The body 24 may be formed from a strong, durable material, such as plastic, to withstand repeated usage thereof. Furthermore, the body 24 is preferably formed from a transparent material to allow a user to see the magnetic elements 16 disposed within the internal compartments 18, as well as the portion of the wall 14 disposed beneath the stud finder 10. In this regard, at least the front wall 36, and preferably the rear wall 36, is formed from a transparent material.

Figure 2:
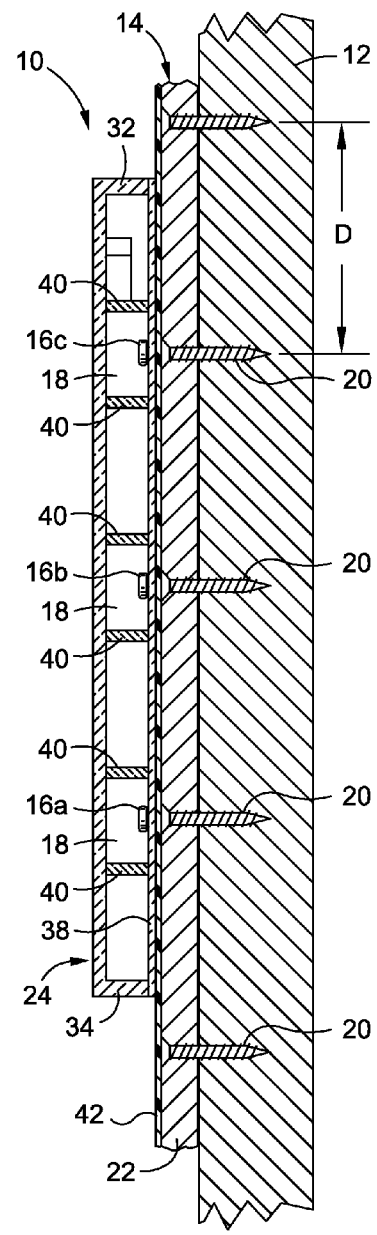
FIG. 2 is a side sectional view of the stud finder depicted in FIG. 1.

The body 24 depicted in FIGS. 1 and 2 includes three internal compartments 18, although it is understood that other embodiments may include fewer than three internal compartments 18 or more than three internal compartments 18. The internal compartments 18 extend between the first and second lateral walls 28, 30 in one direction and between the first and rear faces 36, 38 in another direction. The remaining boundaries of the internal compartments 18 are defined by internal compartment walls 40 which extend from the front face 36 to the rear face 38 and also between the first lateral wall 28 and the second lateral wall 30.

Each magnetic element 16 is disposed within a respective one of the internal compartments 18. The internal compartments 18 are aligned along the axis 26 and spaced from each other to effectively magnetically isolate the magnetic elements 16 from each other. More specifically, the magnetic elements 16 are intended to be attracted to the metallic fasteners 20 disposed within the stud 12, and not to the adjacent magnetic elements 16. For instance, magnetic element 16b is sufficiently spaced from magnetic elements 16a and 16c so that the magnetic fields associated with the magnetic elements 16a-16c does not cause magnetic element 16b to move toward or away from magnetic element 16a or magnetic element 16c. In this respect, the magnetic elements 16a-16c are "magnetically isolated" from each other.

The magnetic elements 16 are freely moveable within the respective internal compartment 18 such that when a metallic object is placed adjacent the internal compartment 18, the magnetic element 16 may be attracted to and move toward the external metallic object. The magnetic element 16 and the elongate body 24 may be configured such that movement of the magnetic element 16 relative to the body 24 may create an audible sound, such as a "clicking" which is created by contact between the magnetic element 16 and the walls/panels of the body 24. Therefore, the stud finder 10 not only provides a visual indication when a stud 12 is found, but the stud finder 10 also provides an audible indication in response to detection of a stud 12.

Figure 3:
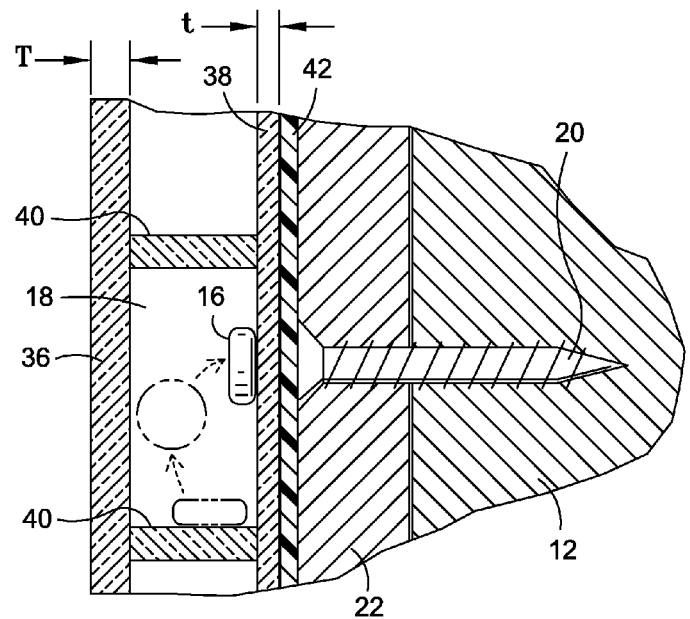
FIG. 3 is an enlarged side sectional view of a magnetic element disposed within an internal compartment of the stud finder, with the dashed lines show the movement of the magnetic element toward a metallic fastener disposed within the stud.

Referring now specifically to FIGS. 2 and 3, there is shown a cross section including the stud 12 and the drywall 22 connected to the stud 12 by a plurality of mechanical fasteners 20. Furthermore, a layer of drywall mud 42 or similar covering material is disposed on the external surface of the drywall 22 to conceal the mechanical fasteners 20. According to various construction standards, the mechanical fasteners 20 should not be spaced a distance "D" more than six inches apart from each other.

The stud finder 10 may be configured in view of the of the above-noted construction standards. Along these lines, the internal compartments 18 may be spaced from each other along the longitudinal axis 26 such that the centers of the internal compartments 18 are approximately six inches apart from each other. Each internal compartment 18 may also define a length along the longitudinal axis 26 to allow the magnetic elements 16 to be magnetically coupled to adjacent mechanical fasteners 20 that are spaced slightly more than six inches apart or slightly less than six inches. In this regard, the stud finder 10 may have multiple magnetic elements 16 that are magnetically coupled to respective metallic elements 20 such that the position of the magnetic elements 16 indicate the precise location of the metallic elements 20, as well as the location of the underlying stud 12. There is a benefit in not only identifying the location of the stud 12, but also the location of the metallic fasteners 20 so the user can avoid the metallic fasteners 20 when inserting new hardware into the stud 12.

In use, the stud finder 10 is placed against or adjacent the wall 14 and is slowly moved along the wall 14 to detect the stud 12. When the stud finder 10 is positioned along the wall 14 such that a magnetic element 16 is not disposed approximate a mechanical fastener 20, the magnetic element 16 may move freely within the internal compartment 18. However, as the stud finder 10 is moved in close proximity to the mechanical fastener 20, the magnetic attraction between the magnetic element 16 and the mechanical fastener 20 causes the magnetic element 16 to move within the internal compartment 18 toward the mechanical fastener 20, as depicted in FIG. 3. More specifically, the dashed line in FIG. 3 shows the movement of the magnetic element 16 within the internal compartment 18 toward the mechanical fastener 20 in response to the magnetic attraction therebetween. The magnetic element 16 moves toward the mechanical fastener 20 until it can no longer move closer to the mechanical fastener 20. When the magnetic element 16 is disposed against the rear wall 38 of the internal compartment 18 next to the mechanical fastener 20, the magnetic element 16 may be "magnetically coupled" to the mechanical fastener 20. Along these lines, when the magnetic element 16 is magnetically coupled to the mechanical fastener 20, the magnetic attraction therebetween will maintain the magnetic element 16 in a stationary position relative to the mechanical fastener 20, while the stud finder 10 may be slightly moved along the wall 14. Therefore, although the magnetic element 16 is physically separated from the mechanical fastener 20 by the rear wall 38 and outer wall layer 42, the magnetic attraction between the magnetic element 16 and the mechanical fastener 20 maintains the magnetic element 16 in place. This provides a visual indication of the location of the mechanical fastener 20 as well as the location of the stud 12.

The stud finder 10 may be configured to mitigate against false detection of the stud 12 by providing an indication as to the location of two mechanical fasteners 20 disposed within the stud 12. In particular, the spacing between the internal compartments 18 generally allows at least two magnetic elements 16 to become mechanically coupled to the metallic elements 20. In the embodiment shown in FIGS. 1 and 2, three magnetic elements 16a, 16b, 16c are each mechanically coupled to respective metallic elements 20. The axial alignment of the internal compartments 18 is similar to the generally axial alignment of the metallic elements 20 disposed within the stud 12. Those skilled in the art will appreciate that the metallic elements 20 may not be perfectly aligned along a common axis. However, the width of the internal compartments 18, defined as the distance between the first wall 28 and the second wall 30, may compensate for such deviations from a common axis.

The body 24 is configured so as to allow the above-described magnetic coupling between the magnetic element 16 and the mechanical fastener 20. To this end, one or more walls of the body 24 may be thin enough to allow the magnetic element 16 to be disposed in close enough proximity to the mechanical fastener 20 to allow for magnetic coupling therebetween. In the embodiment depicted in FIGS. 2 and 3, the thickness "t" of the rear wall 38 has been minimized to allow for the magnetic coupling described above. The front wall 36 defines a wall thickness "T," which is In this regard, the rear face 38 may define a thickness "t" that is smaller than the thickness "T" defined by the front face 36 and remaining walls 28, 30, 32, 34.

Figure 4:
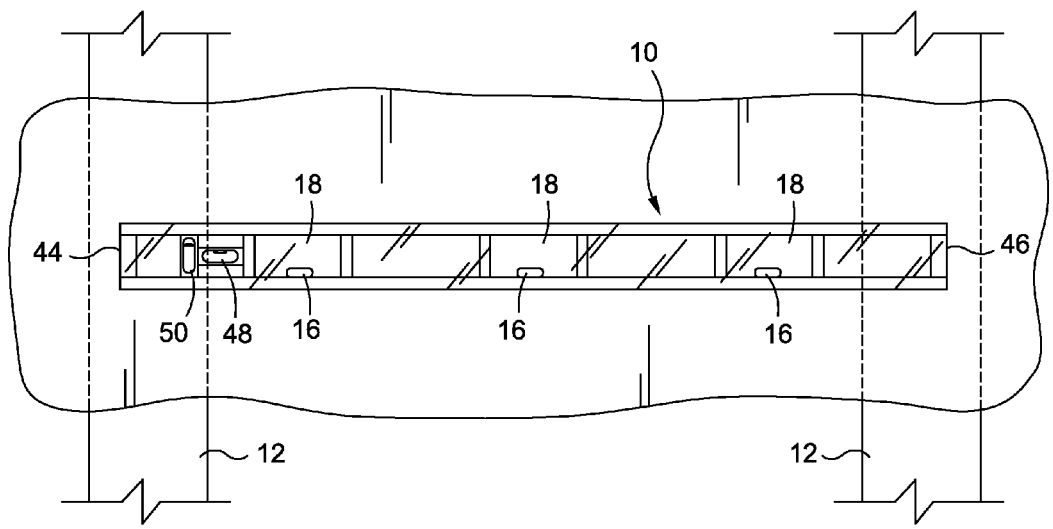
FIG. 4 is a front view of the stud finder extending between a pair of studs.

Referring now to FIG. 4, the stud finder 10 may be configured to easily locate adjacent studs 12. Along these lines, various construction codes and regulations require that adjacent studs 12 are generally spaced from each other such that the center of the studs is approximately sixteen inches apart. Therefore, the length "L" of the body 24 may be 16 inches. The length L may be defined by a first end 44 and an opposed second end 46 of the body 24.

The stud finder 10 depicted in FIGS. 1 and 4 additionally includes a first level 48 and a second level 50 to indicate when the body 24 is aligned with a horizontal and vertical axis. Therefore, when the location of the stud 12 is identifies, the levels will assist in determining the axis along which the stud 12 extends. Furthermore, the levels may identify a horizontal axis which the stud finder may extend along to measure the distance between adjacent studs 12.

Although the drawings show a stud finder 10 having multiple internal compartments 18, it is contemplated that other embodiments may only include one internal compartment 18 without departing from the spirit and scope of the present invention.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combinations described herein. Thus, the scope of the claims is not to be limited by the illustrated embodiments.

What is claimed is:

1. A stud finder for use in locating a stud having a metallic element disposed therein, the stud finder comprising:
    a body having an internal compartment; and
    a magnetic element irremovably confined within the internal compartment and freely moveable therein, wherein the magnetic element is not restricted about any axis within the internal compartment;
    the body and magnetic element being configured such that the magnetic element is magnetically attracted to the metallic element located exteriorly to the body when the internal compartment is disposed adjacent the metallic element.

2. The stud finder as recited in claim 1, wherein:
    the body is elongate and includes a plurality of internal compartments formed therein and aligned in an axial array; and
    the magnetic element includes a plurality of magnetic elements, each magnetic element being disposed within a respective one of the plurality of internal compartments.

3. The stud finder as recited in claim 2, wherein each internal compartment is spaced from an adjacent one of the plurality of internal compartments.

4. The stud finder as recited in claim 2, wherein each internal compartment is spaced from an adjacent one of the plurality of internal compartments such that the magnetic elements disposed in adjacent compartment are magnetically isolated from each other.

5. The stud finder as recited in claim 2, wherein the body defines a longitudinal axis, each internal compartment defining a longitudinal center along the longitudinal axis, the longitudinal centers of adjacent internal compartments being spaced less than six inches.

6. The stud finder as recited in claim 1, wherein the body includes a transparent wall having an inner surface defining at least a portion of the internal compartment and an outer surface defining at least a portion of an external surface of the body wherein said magnetic element is viewable in the body.

7. The stud finder as recited in claim 1, wherein the body includes a first end and an opposing second end to define a body length therebetween, the body length being sixteen inches.

8. The stud finder as recited in claim 1, wherein the body includes a planar exterior surface configured to be disposable adjacent the wall.

9. The stud finder as recited in claim 1, wherein the body and magnetic element are configured to emit an audible detection signal and a visual detection signal in response to the stud finder being aligned with the metallic fastener.

10. The stud finder as recited in claim 9, wherein the audible detection signal is generated by contact between the magnetic element and the body.

11. The stud finder as recited in claim 1, wherein the body is formed from a transparent material.

12. The stud finder as recited in claim 1, wherein the body is formed from a plastic material.

13. The stud finder as recited in claim 1, further comprising a level connected to the body, the level configured to indicate one of a horizontal axis and a vertical axis.

14. The stud finder as recited in claim 1, wherein the magnetic element is detached from the body.

15. A stud finder for detecting the location of a stud within a wall, wherein the stud includes a metallic fastener inserted within the stud, the stud finder comprising:
a body having an internal compartment formed therein and having inner walls forming said inner compartment; and
a magnetic element irremovably confined within the internal compartment and freely moveable therein, the magnetic element being magnetically attractable to the metallic fastener through an inner wall such that the magnetic element remains stationary relative to the metallic fastener as the body is moved adjacent the metallic fastener.

16. The stud finder as recited in claim 15, wherein:
the body includes a plurality of internal compartments formed therein; and
the magnetic element includes a plurality of magnetic elements, each magnetic element being disposed within a respective one of the plurality of internal compartments.

17. The stud finder as recited in claim 16, wherein each internal compartment is spaced from an adjacent one of the plurality of internal compartments such that the magnetic elements disposed in adjacent compartment are magnetically isolated from each other.

18. The stud finder as recited in claim 15, wherein the magnetic element is moveable relative to the body about at least two axes.

19. The stud finder as recited in claim 15, wherein the body is formed from a transparent material.

20. A stud finder for use in locating a stud having a metallic element disposed therein, the stud finder comprising:
an elongate body having an internal compartment; and
a magnetic element irremovably confined within the internal compartment and freely moveable within the body, wherein the magnetic element is not restricted about any axis within the internal compartment, the magnetic element being configured to be magnetically attracted to the metallic element when the internal compartment is disposed adjacent the metallic element;
the body and magnetic element being configured to provide a visual confirmation of magnetic attraction between the magnetic element and the metallic element.

21. The stud finder as recited in claim 20, wherein the body and magnetic element are configured to collectively provide an audible confirmation of magnetic attraction between the magnetic element and the metallic element.

* * * * *